United States Patent [19]

Naritomi et al.

[11] 4,172,729

[45] Oct. 30, 1979

[54] PHOTOSENSITIVE DIAZO LITHOGRAPHIC PRINTING PLATE WITH OXALIC ACID AS STABILIZER

[75] Inventors: Yasuhisa Narutomi; Kesanao Kobayashi; Teruo Mori, all of Shizuoka, Japan

[73] Assignee: Fuji Photo Film Co., Ltd., Minami-ashigara, Japan

[21] Appl. No.: 810,699

[22] Filed: Jun. 28, 1977

[30] Foreign Application Priority Data

Jun. 28, 1976 [JP] Japan .................................. 51/76745

[51] Int. Cl.² .......................... G03C 1/60; G03C 1/94
[52] U.S. Cl. ........................................ 96/75; 96/33; 96/91 R
[58] Field of Search .......................... 96/33, 75, 91 R

[56] References Cited

U.S. PATENT DOCUMENTS

| | | | |
|---|---|---|---|
| 2,703,756 | 3/1955 | Herrick et al. | 96/75 |
| 2,714,066 | 7/1955 | Jewett et al. | 96/75 |
| 2,871,119 | 1/1959 | Weegar et al. | 96/75 |
| 2,922,715 | 1/1960 | Gumbinner | 96/33 |
| 2,937,085 | 5/1960 | Seven et al. | 96/91 R |
| 2,946,683 | 7/1960 | Mellan et al. | 96/33 |
| 3,064,562 | 11/1962 | Deal | 96/33 |
| 3,136,636 | 6/1964 | Dowdall et al. | 96/33 |
| 3,181,461 | 5/1965 | Fromson | 96/33 |
| 3,334,584 | 8/1967 | Sites | 96/93 |
| 3,396,019 | 8/1968 | Uhlig | 96/75 |
| 3,408,192 | 10/1968 | Aebi | 96/75 |
| 3,615,484 | 10/1971 | Yoshida | 96/75 |
| 3,615,532 | 10/1971 | Silver | 96/75 |
| 3,679,419 | 7/1972 | Gillich | 96/91 R |
| 3,700,480 | 10/1972 | Murashige | 96/75 |
| 3,759,711 | 9/1973 | Rauner et al. | 96/75 |
| 3,840,390 | 10/1974 | Kozu et al. | 96/91 R |
| 3,841,874 | 10/1974 | Nishino | 96/91 R |
| 4,123,276 | 10/1978 | Kita et al. | 96/91 R |

OTHER PUBLICATIONS

Kosar, J., "Light-Sensitive Systems", J. Wiley & Sons, 1965, p. 292.

Weiner et al., *Institute of Paper Chemistry, Biblio Series* #220, "Diazotype Papers", p. 56.

*Primary Examiner*—Charles L. Bowers, Jr.
*Attorney, Agent, or Firm*—Sughrue, Rothwell, Mion, Zinn and Macpeak

[57] ABSTRACT

A photosensitive diazo composition for a pre-sensitized lithographic plate which exhibits an extended shelf life as well as improved printing performance, the composition comprising (a) a diazonium compound, (b) an organic high molecular weight binder, and (c) from about 0.1 to about 5% by weight of oxalic acid or a salt thereof.

6 Claims, No Drawings

PHOTOSENSITIVE DIAZO LITHOGRAPHIC PRINTING PLATE WITH OXALIC ACID AS STABILIZER

BACKGROUND OF THE INVENTION

1. Field of the Invention

This invention relates to a stabilized, photosensitive diazo composition and to a pre-sensitized lithographic plate using the same.

2. Description of the Prior Art

Various diazonium compounds, of which a diazo resin is the most common, represented by the condensate of p-diazodiphenylamine with formaldehyde, are used as the photosensitive material in pre-sensitized lithographic plates. A pre-sensitized plate can be prepared by coating such a diazo resin on a suitable support such as paper, a synthetic resin film or a metal, and when the plate is exposed to actinic radiation through a transparent negative original, the diazo resin at the exposed area decomposes and is rendered insoluble. On the other hand, the non-exposed areas can be removed using water so as to uncover the underlying support surface. When a support which has been treated to render the surface hydrophilic is used, development uncovers such a hydrophilic surface at the non-irradiated areas. Thus, when the developed plate is placed in an offset printing machine, these hydrophilic areas are receptive to water and repel ink, while the decomposed diazo resin which remains is oleophilic and is receptive to ink and repels water. In other words, such a photosensitive material enables a positive plate to be produced from a negative original.

Various compositions for the photosensitive layer of this kind of pre-sensitized lithographic material can be divided into two types; one type without any binder, i.e., comprising solely a diazo resin such as is disclosed in, for example, U.S. Pat. No. 2,714,066, and the other type comprising a mixture of a diazo resin with a binder such as is disclosed in, for example, U.S. Pat. No. 2,826,501 and British Pat. No. 1,074,392. In the case of the former type, the coating thickness of the photosensitive layer is small, usually corresponding to a coating weight of from about 20 to about 100 mg/m² due to the lack of binder, and thus this results in the image obtained having insufficient abrasion resistance. Thus, reinforcement of such an image which exhibits poor printing performance by itself is necessary. Usually an emulsified lacquer is applied onto the plate during or subsequent to development whereby the resinous ingredient in the lacquer emulsion adheres selectively to the image areas. By such a treatment, the image becomes resistant to abrasion or stripping actions occurring during printing, and therefore, a large number of prints can be produced therefrom. The lacquer used for such a purpose must have superior abrasion resistance, have a high affinity to the image area, and not tend to form scum or redeposit. To meet these requirements, many approaches have been made including the techniques disclosed in, for example, U.S. Pat. No. 2,754,279. An essential problem in this approach is, however, that the ultimate user of the printing material has to carry out this operation of lacquer coating, and as a result, the performance of the printing plate thus treated importantly depends on the skill with which this operation is performed. This means that the operator must always have a sufficiently high level of expertise. To overcome this difficulty an improvement has been developed in which a photosensitive coating is used comprising a photosensitive compound and a highly abrasion-resistant resin mixed therewith which can be cross-linked with the photo-decomposed product from the diazonium compound (e.g., as disclosed in U.S. Pat. No. 2,826,501 and British Pat. No. 1,074,392). In other words, a resinous ingredient corresponding to that contained in the lacquer conventionally employed is blended with a diazo resin and the mixture is coated in an increased coating thickness (about 0.5 to about 5.0 g/m²); at development unnecessary portions, i.e., unhardened areas, are removed from the support surface by making use of the difference in solubility between the hardened and unhardened areas. Thus, an effect is achieved substantially equivalent to or better than that achieved with a lacquer application subsequent to development.

In attempting to incorporate such a resin into the composition, however, the compatibility between the resin and the diazo resin as well as suitable selection of a common solvent for both must be considered. Moreover, the composition must be formulated so that either the photosensitive coating on the whole is rendered insoluble upon the photo-decomposition of the photosensitive component, or a clear difference in solubility or swelling ability between the exposed and unexposed areas occurs. Further, the resin to be used as a binder must not degrade the storage stability of the resulting printing plate in which it is present together with the photosensitive diazonium compound. Certain kinds of water-soluble colloids are known to provide photoresist images of excellent quality when used as a binder for a diazo resin. However, the photosensitivity is completely lost in several days only due to dark reactions. Although various proposals have been made for a material meeting the requirement just mentioned in a number of known approaches, none of these known approaches satisfy all the requirements as to hardening efficiency, durability in printing, oleophilicity, storage stability, etc.

Japanese patent application (OPI) No. 118,802/1975 (corresponding to U.S. patent application Ser. No. 551,106, filed Feb. 20, 1975) discloses a photosensitive composition which meets almost all of these requirements, in which the composition comprises a binder polymer comprising 2-hydroxyethyl methacrylate, acrylonitrile, methyl methacrylate and methacrylic acid and a diazonium compound. When such a photosensitive composition comprising the above-described polymer and a diazonium compound is used for a pre-sensitized lithographic printing plate, excellent properties are achieved. Unfortunately, probably because adhesion to the metal support is too strong, particularly to an anodized aluminum plate, such a photosensitive coating, when exposed through a transparent negative original after several months from production thereof have elapsed, gives rise to an imperfect removal of the non-irradiated areas upon development, thus stains or scumming in the non-irradiated areas occurs. Such a disadvantageous tendency becomes more marked when the plate has been stored under adverse storage conditions (e.g., at 45° C. and 75% RH) for several days.

SUMMARY OF THE INVENTION

Accordingly, an object of the invention is to provide a photosensitive composition which overcomes the above-described drawbacks and which, thus, will not give rise to stains in the non-irradiated areas even after storage under normal conditions for several months or after storage under adverse conditions for several days.

Another object of the present invention is to provide a pre-sensitized lithographic plate having good shelf-life, particularly under adverse storage conditions.

The above objects and other objects are accomplished, as a result of extensive research, by incorporating from about 0.1 to about 5% by weight of oxalic acid or a salt thereof into a photosensitive composition comprising (a) a diazonium compound and (b) an organic polymer binder whereby the shelf life of the resulting photosensitive diazo composition is noticeably improved without adversely affecting the adhesion to the substrate at all. For the present purpose, oxalic acid or the salt thereof may or may not contain water of crystallinity.

Accordingly, in one embodiment this invention provides a photosensitive composition comprising (a) a diazonium compound, (b) an organic high molecular weight binder, and (c) from about 0.1 to about 5% by weight of oxalic acid or a salt thereof.

In a further embodiment of this invention, the invention provides a pre-sensitized lithographic plate comprising a support having thereon a layer of the photosensitive composition described above.

DETAILED DESCRIPTION OF THE INVENTION

The diazonium compound used for the present invention includes diazo resins represented by the condensation products of a diazonium salt or p-diazodiphenylamine with formaldehyde which are photosensitive and insoluble in water but soluble in various, common organic solvents such as $\beta$-oxyethylmethyl ether (Methyl Cellosolve), dimethylformamide, methyl alcohol, ethylene dichloride and the like.

Among these diazonium compounds, those which are compatible with the organic polymer binder used in the present invention are preferred.

Most preferred diazonium compounds which can be used are compounds containing at least 2 diazo groups per molecule, such as salts of condensates of p-diazodiphenylamine with formaldehyde, e.g., the phenol salt, the fluorocapric acid salt and sulfonic acid salts, such as the salts of triisopropylnaphthalenesulfonic acid, 4,4-biphenyldisulfonic acid, 5-nitro-o-toluenesulfonic acid, 5-sulfosalycilic acid, 2,5-dimethylbenzenesulfonic acid, 2-nitrobenzenesulfonic acid, 3-chlorobenzenesulfonic acid, 3-bromobenzenesulfonic acid, 2-chloro-5-nitrobenzenesulfonic acid, 2-fluorocaprylnaphthalenesulfonic acid, 1-naphthol-5-sulfonic acid, 2-methoxy-4-hydroxy-5-benzoylbenzenesulfonic acid and p-toluenesulfonic acid. Other diazonium compounds which may also be used suitably are salts with the above-described acids of condensates of 2,5-dimethoxy-4-p-tolylmercaptobenzenediazonium with formaldehyde and of condensates of 2,5-dimethoxy-4-morpholinobenzenediazonium with formaldehyde, and compounds, as disclosed in Japanese patent application (OPI) No. 33,907/1973, represented by the following general formula:

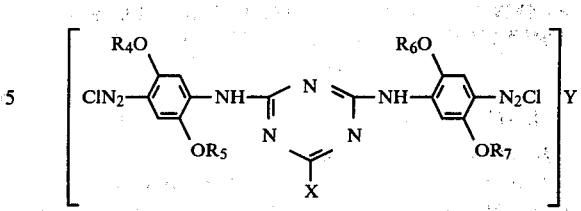

wherein:
$R_4$, $R_5$, $R_6$ and $R_7$, which may be the same or different, each represents an alkyl group containing 1 to 4 carbon atoms, such as methyl, ethyl, propyl or butyl;

X represents a substituted amino group, such as N-($\beta$-hydroxyethyl)amino, N,N-di($\beta$-hydroxyethyl)amino or a like hydroxyalkylamino group; and Y represents an anion of the coupling agent as described above; examples are: 2-methoxy-4-hydroxy-5-benzoyl benzenesulfonate of 2,6-bis(4-diazo-2,5-dimethoxyphenylamino)-4-N,N-(di-$\beta$-hydroxyethyl)amino-1,3,5-triazine, 2-methoxy-4-hydroxy-5-benzoylbenzenesulfonate of 2,6-bis(4-diazo-2,5-dimethoxyphenylamino)-4-N-($\beta$-hydroxyethyl)amino-1,3,5-triazine, and 2-methoxy-4-hydroxy-5-benzoylbenzenesulfonate of 2,6-bis(4-diazo-2,5-diethoxyphenylamino)-4-N-($\beta$-hydroxyethyl)amino-1,3,5-triazine.

These diazonium compounds are disclosed in Japanese patent application (OPI) No. 118,802/1975 (corresponding to U.S. patent application Ser. No. 551,106, filed Feb. 20, 1975, now abandoned, but refiled as a continuation in U.S. patent application Ser. No. 760,371, filed Jan. 18, 1977, now U.S. Pat. No. 4,123,276).

Still other suitable diazonium compounds which can be used are those as disclosed in U.S. Pat. No. 2,649,373, the entire disclosure of which is hereby incorporated by reference and relied upon.

The most preferred diazonium compound is 2-methoxy-4-hydroxy-5-benzoylbenzenesulfonic acid salt of the condensate of p-diazodiphenylamine with formaldehyde.

A suitable amount for such a diazonium compound (a) ranges from about 5 to about 50% by weight, more preferably from 7 to 20% by weight, based on the total weight of the photosensitive composition of the present invention.

Examples of organic polymer binders blended with the diazonium compound which can be used include organic, high molecular weight materials which are insoluble in water, but which contain hydrophilic functional groups such as hydroxyl, ether, carboxylic acid, amide, urethane, etc., groups including polyvinylbutyral, polyvinylformal, shellac, or those described in Japanese patent application (OPI) No. 118,802/1975 (corresponding to U.S. patent application Ser. No. 551,106, filed Feb. 20, 1975), etc. A suitable molecular weight, as measured by gel permeation chromatography, of the organic polymer binder which can be employed in the invention ranges from about 10,000 to about 200,000.

The organic high molecular weight material disclosed in Japanese patent application (OPI) No. 118,802/1975 is characterized by that it contains both of the recurring units represented by the following general formula (I):

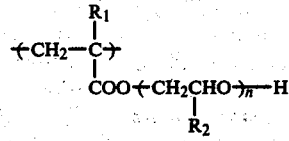

(I)

and by the general formula (II):

(II)

wherein in the general formula (I) $R_1$ represents a hydrogen atom or a methyl group, $R_2$ represents a hydrogen atom, a methyl group, an ethyl group or a chloromethyl group, and n an integer from 1 to 10; and in the general formula (II), $R_3$ represents a hydrogen atom or a methyl group; and that it has an acid value of from about 10 to about 100.

According to the disclosure in Japanese patent application (OPI) No. 118,802/1975, a photosensitive composition can be formulated by using the organic polymer binder described above alone or by further incorporating therein another resinous material containing hydrophilic groups. This is true in this invention as well.

The copolymers defined above and containing the recurring units represented by the general formula (I) and the general formula (II) include, for example, three-, four- or multi-component copolymers resulting from copolymerizing a monomer represented by the following general formula (III), acrylonitrile or methacrylonitrile, an $\alpha,\beta$-unsaturated carboxylic acid or anhydride thereof, and optionally other addition-polymerizable unsaturated compounds

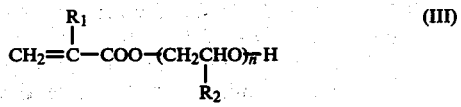

(III)

In the general formula (III), $R_1$, $R_2$ and n have the same meaning as in the general formula (I).

Further, the copolymers include products resulting from the reactions of a cyclic acid anhydride with two- or three-component copolymers comprising a monomer represented by the general formula (III), acrylonitrile or methacrylonitrile and optionally other addition-polymerizable unsaturated compounds whereby the products involve a half-ester structure resulting from such a cyclic acid anhydride.

More specifically, copolymers containing therein the recurring units (I) and (II) as described above can be produced by copolymerizing a monomer having therein the repeating unit (II) with a monomer of the general formula (III). Three component copolymers can be produced by copolymerizing acrylonitrile or methacrylonitrile with a monomer of the general formula (III) and additionally with an addition-polymerizable compound such as methyl acrylate or methyl methacrylate and in order to control the acid value of the copolymer to about 10 to about 100, a cyclic acid anhydride is additionally employed. Four component copolymers can be produced by copolymerizing acrylonitrile or methacrylonitrile with a monomer of the formula (III) with additionally an $\alpha,\beta$-unsaturated carboxylic acid such as acrylic acid or methacrylic acid and further with an addition-polymerizable compound such as methyl acrylate or methyl methacrylate, the $\alpha,\beta$-unsaturated carboxylic acid such as acrylic acid or methacrylic acid being added in order to control the acid value of the copolymer to about 10 to about 100.

Typical examples of the $\alpha,\beta$-unsaturated carboxylic acid and anhydrides thereof are acrylic acid, methacrylic acid, ethacrylic acid, maleic anhydride, methylmaleic anhydride, phenylmaleic anhydride, crotonic acid, itaconic acid, vinylbenzoic acid, sorbic acid, cinnamic acid, allylsulfonic acid, vinylsulfonic acid, vinylbenzenesulfonic acid (including all three isomers, i.e., ortho, meta and para), mono-2-hydroxyethyl itaconate, mono-2-hydroxypropyl itaconate, mono-2-hydroxyethyl citraconate, mono-2-hydroxyethyl aconitate, mono-2-hydroxyethyl maleate, mono-2-hydroxyethyl fumarate, monomethyl itaconate and monoethyl itaconate.

Examples of addition polymerizable unsaturated compounds which can be used include those containing one addition polymerizable ethylenically unsaturated bond, such as acrylates, acrylamides, methacrylates, methacrylamides, allyl compounds, vinyl ethers, vinyl esters, styrenes, crotonates and the like. Specific examples of these compounds are: acrylates, such as alkyl acrylates, e.g., methyl acrylate, ethyl acrylate, propyl acrylate, butyl acrylate, amyl acrylate, octyl acrylate, 2-ethylhexyl acrylate, tert-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate and tetrahydrofurfuryl acrylate, and aryl acrylates, e.g., phenyl acrylate; methacrylates, such as alkyl methacrylates, e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate and tetrahydrofurfuryl methacrylate, and aryl methacrylates, e.g., phenyl methacrylate, cresyl methacrylates, e.g., p-cresyl methacrylate, and naphthyl methacrylates, e.g., $\alpha$-naphthyl methacrylates; acrylamides, such as acrylamide itself, N-alkylacrylamides wherein the alkyl moiety is, e.g., methyl, ethyl, propyl, butyl, tert-butyl, heptyl, octyl, cyclohexyl, hydroxyethyl or benzyl, N-arylacrylamides wherein the aryl moiety is, e.g., phenyl, tolyl, nitrophenyl, naphthyl or hydroxyphenyl, N,N-dialkylacrylamides wherein the alkyl moiety is, e.g., methyl, ethyl, butyl, isobutyl, ethylhexyl or cyclohexyl, e.g., N,N-dimethylacylamide, N,N-diethylacrylamide, N-methyl-N-propylacrylamide, N,N-diarylacrylamides wherein the aryl moiety is, e.g., phenyl, e.g., N,N-diphenylacrylamide, N-methyl-N-phenylacrylamide, N-hydroxyethyl-N-methylacrylamide, N-2-acetamidethyl-N-acetylacrylamide; methacrylamides, such as methacrylamide itself, N-alkylmethacrylamides wherein the alkyl moiety is, e.g., methyl, ethyl, tert-butyl, ethylhexyl, hydroxyethyl or cyclohexyl, N-arylmethacrylamides wherein the aryl moiety is, e.g., phenyl, N,N-dialkylmethacrylamides wherein the alkyl moiety is, e.g., ethyl, propyl or butyl, e.g., N,N-dimethyl methacrylamide and N,N-diethyl methacrylamide, N,N-diarylmethacrylamides wherein the aryl moiety is, e.g., phenyl, e.g., N,N-diphenyl methacrylamide, N-hydroxyethyl-N-methylmethacrylamide, N-methyl-N-phenylmethacrylamide and N-ethyl-N-phenylmethacrylamide; allyl compounds, such as allyl esters, e.g., allyl acetate, allyl caproate, allyl caprylate, allyl laurate, allyl propionate, allyl palmitate, allyl stearate, allyl benzoate, allyl acetoacetate and allyl lactate, and allyloxyethanol; vinyl ethers, such as alkyl vinyl ethers, e.g., hexyl vinyl ether, octyl vinyl ether, ethyl vinyl ether, methyl vinyl ether, decyl vinyl ether, ethylhexyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethyleneglycol vinyl ether, dimethylaminoethyl vinyl ether, diethylaminoethyl vinyl ether, benzyl vinyl ether and tetrahydrofurfuryl vinyl ether, and vinyl aryl ethers, e.g., vinyl phenyl ether, vinyl tolyl ethers, e.g., vinyl p-tolyl ether, vinyl chlorophenyl ethers, e.g., vinyl p-chlorophenyl ether, vinyl 2,4-dichlorophenyl ether, vinyl naphthyl ethers, e.g., vinyl β-naphthyl ether, and vinyl anthranyl ether; vinyl esters, e.g., vinyl butyrate, vinyl isobutyrate, vinyl acetate, vinyl propionate, vinyl stearate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl β-phenylbutylate, vinyl chlorobenzoate, vinyl cyclohexylcarboxylate, vinyl benzoate, vinyl salicylate, vinyl tetrachlorobenzoate and vinyl naphthoate; styrenes, such as styrene itself, alkylstyrenes, e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrenes, e.g., p-chloromethyl styrene, trifluoromethylstyrene, ethoxymethylstyrene and acetoxymethylstyrene, alkoxystyrenes, e.g., methoxystyrene, e.g., 4-methoxystyrene, 4-methoxy-3-methylstyrene and dimethoxystyrene, and halostyrenes, e.g., chlorostyrene, dichlorostyrene, e.g., 2,4-dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene and 4-fluoro-3-trifluoromethylstyrene; crotonates, such as alkyl crotonates, e.g., butyl crotonate, hexyl crotonate and glycerol monocrotonate; dialkyl itaconates, e.g., dimethyl itaconate, diethyl itaconate and dibutyl itaconate; and dialkyl maleates and fumarates, e.g., dimethyl maleate and dimethyl fumarate. Any other addition polymerizable unsaturated compounds may be used as long as they are copolymerizable with a monomer of the above general formula (III) and acrylonitrile or methacrylonitrile. However, addition polymerizable compounds having a functional group capable of reacting at room temperature with the hydroxyl group contained in the 2-hydroxyethyl acrylate or methacrylate and polyfunctional addition polymerizable unsaturated compounds having two or more polymerizable vinyl or vinylidene groups in a molecule are less desirable than compounds having only one such group.

Suitable cyclic acid anhydrides used to half-esterify the copolymers comprising a monomer represented by the general formula (III), acrylonitrile or methacrylonitrile, and optionally other addition-polymerizable unsaturated compounds include phthalic anhydride, tetrahydrophthalic anhydride, etc.

The above defined copolymers should preferably have acid values ranging from about 10 to about 100, and more preferably from 15 to 40. In the case of an acid value below about 10, development cannot be achieved easily with an aqueous alkaline solution, while for an acid value higher than about 100 the oleophilicity of the image area becomes too low, thus making the photosensitive composition based on the polymer unsuitable for lithographic use.

A marked advantage achieved by copolymerizing acrylonitrile or methacrylonitrile is the suppression of the degree of swelling of the image area during development with a weakly alkaline aqueous solution, and thus the improvement in the abrasion resistance thereof. When copolymer comprising only monomers represented by the general formula (III), and an α,β-unsaturated carboxylic acid is employed to formulate a photosensitive composition, the resulting image area of the photosensitive coating always swells too much during development, and has low abrasion resistance.

Another advantage achieved with the use of acrylonitrile or methacrylonitrile as a copolymerization component is an improvement in the printing durability of the resulting lithographic plate, which enables the plate to be used to produce two or three times the number of prints compared to that resulting from a lithographic plate based on a copolymer not including acrylonitrile or methacrylonitrile.

A preferred amount of acrylonitrile or methacrylonitrile, i.e., the recurring unit represented by the above-described general formula (II) in the above-cited copolymer should be about 5 to about 60, more preferably 10 to 40, % by weight. With a content below about 5% by weight, the above-described advantageous effects are not achieved, while a content higher than about 60% by weight tends to give rise to undesirable solubility characteristics. A preferred range of the amount of the recurring unit represented by the general formula (I) is from about 30 to about 80, more preferably from 40 to 60, % by weight of the copolymer. With a content below about 30% by weight, the image area has insufficient mechanical strength, and further developability becomes also a problem. An amount above 80% by weight is undesirable, since too much swelling takes place at the image area during development, which is further reflected in a poor ink-receptivity. The other monomer units which may be present may be present in an amount of up to 65% by weight of the copolymer.

The above-described polymer binder may be used individually or in combination.

Of the various copolymers belonging to those defined hereinbefore, those which are disclosed in Japanese patent application (OPI) No. 118,802/1975 are especially suitable to accomplish the various advantages effected by the present invention.

Such an organic polymer binder (b) is appropriately present in the photosensitive composition prepared in accordance with the present invention in a range of from about 50 to about 95% by weight, and preferably from 60 to 92% by weight, of the weight of the photosensitive composition.

As required, additives such as dyes, pigments, stabilizers, plasticizers and fillers can be incorporated in the photosensitive composition of the present invention in an amount of not higher than about 20% by weight based on the weight of the photosensitive composition in order to improve the various properties thereof. Dyes which are added to provide a visible contrast between the support surface and the image area after development should not react with the diazonium compound used and are selected from those which will neither discolor nor dissolve away the dyed image area during development. Suitable dyes include oil soluble dyes such as, for example, Oil Blue #603 (a product of Orient Chemical Ind. Co.), Aizen Spyron Blue GNH, Aizen Spyron Red 2BH (both products of Hodogaya Chemical Ind. Co.), Zapon Fast Fairy Red B (a product of Badische Aniline & Soda Fabrik A.G.), etc. Such dyes are used in such an amount which provides a clear optical contrast between the exposed support surface and the image area. A suitable amount generally is about 7% by weight or less based on the total weight of photosensitive composition.

The photosensitive composition of the present invention is suitable for the photosensitive coating of a lithographic plate. Suitable supports which can be used include paper, synthetic resin films such as those of polyvinyl acetate, metals such as zinc, copper, aluminum, stainless steel, specially treated steel plates, etc., glass, etc. Prior to the coating of the coating composition onto such a support for the purpose of producing a pre-sensitized lithographic plate, the surface of the support is usually passivated to prevent harmful interactions which might otherwise take place between the surface and the diazonium compound. Such a passivation treatment also promotes a firm adhesion between the exposed area of the coating and the substrate and further aids in providing a highly hydrophilic surface during printing using the plate produced therefrom. One example of such a passivation treatment is disclosed in U.S. Pat. No. 2,714,066, in which metallic supports are treated with silicate salts. Another example is a treatment with an aqueous potassium fluorozirconate solution described in U.S. Pat. No. 2,946,638. Other treatments include a phosphomolybdate treatment described in U.S. Pat. No. 3,201,247, an electro-deposition of silicate described in U.S. Pat. No. 3,658,662, etc. Furthermore, an aluminum plate may be anodized in phosphoric or sulfuric acid followed by treatment with a silicate salt as described above. The photosensitive composition of the present invention may be coated on such a support in an amount of from about 0.1 to about 5.0 g/m$^2$.

On the other hand, in order to prevent the formation of scumming in non-image areas even when the pre-sensitized lithographic plate comprising the above-described photosensitive composition provided on a metal support, particularly on an anodized aluminum plate, is subjected to printing after several months storage under normal ambient conditions or several days storage under extremely adverse conditions such as at 45° C. and 75% RH, oxalic acid or a salt thereof (e.g., a sodium, potassium or ammonium salt of oxalic acid) is effectively used. A suitable amount of oxalic acid or the salt thereof ranges from about 0.1 to about 5% by weight, more preferably from 0.2 to 4% by weight, based on the total amount of the above-described photosensitive composition.

When the pre-sensitized lithographic printing plate prepared in accordance with the present invention is exposed to actinic radiation through a transparent negative original, the irradiated areas undergo a photochemical change with a difference in the degree of swelling from the non-irradiated areas occurring on subsequent development. Suitable light sources which can be used for the irradiation are a metal halide lamp, a mercury lamp, a carbon arc lamp and the like. When a metal halide lamp (3.5 A) is used, a suitable irradiation time is about 40 seconds to about one minute at a distance of 1 m between the light source and the pre-sensitized plate, and when a carbon arc lamp (30 A) is used, a suitable irradiation time is about 50 seconds to about 1.5 minutes at a distance of 70 cm between the light source and the pre-sensitized plate. These exposure times are merely exemplary and should not be considered as limiting in any manner.

Development can be carried out by bringing the exposed plate into contact with a developer comprising a weakly alkaline aqueous solution having a pH of about 9.5 to about 11.5.

Useful developers include aqueous solutions of inorganic and organic alkaline materials such as, for example, sodium silicate, sodium hydroxide, monoethanolamine, etc. It is generally desirable to incorporate anionic surfactants and alcohols into the developer. Suitable anionic surfactants include, for example, potassium salt of rhodinic acid, sodium isopropylnaphthalenesulfonate, etc., while benzyl alcohol and diacetone alcohol are often used as the alcohols. Useful amounts of these components, alkaline agent, surfactant and alcohol range from about 0.1 to about 10% by weight, and preferably from 0.5 to 5% by weight, respectively, based on the developer solution weight.

The photosensitive composition of the present invention can be readily developed using the above-described aqueous weakly alkaline developer, and moreover, provides the ability to use various development conditions, which makes the practice of development quite easy. The development can be suitably carried out under conditions of a temperature ranging from about 10° to about 30° C. and for a period of time ranging from about 30 seconds to about 3 minutes.

The photosensitive composition in accordance with the present invention is explained in greater detail below by reference to some specific examples and comparison examples. Unless otherwise indicated herein, all parts, percents, ratios and the like are by weight.

EXAMPLE 1

Into 300 g of 2-methoxyethanol heated to 100° C. under a nitrogen atmosphere were added dropwise over a period of 2 hours a mixture comprising 150 g of 2-hydroxyethyl methacrylate, 60 g of acrylonitrile, 79.5 g of methyl methacrylate, 10.5 g of methacrylic acid, and 1.2 g of benzoyl peroxide. 15 minutes after the termination of the addition, 300 g of 2-methoxyethanol and 0.3 g of benzoyl peroxide were further added to the reaction system, which was then left to stand for 4 hours. After the reaction ended, the entire mixture diluted with methanol was added to water to precipitate the resultant copolymer, which was dried in vacuo at 70° C. The copolymer thus obtained which contained 2-hydroxyethyl methacrylate (Copolymer I) had an acid value of 20.

A 0.15 mm thick, 2S aluminum plate was degreased by immersing the plate in a 10% aqueous solution of sodium phosphate kept at 80° C. for 3 minutes, then subjected to surface graining with a nylon brush, then etched with sodium aluminate at 60° C. for about 10 seconds, and then subjected to a desmuting treatment with a 3% sodium bisulfate aqueous solution. The plate thus processed was then anodized in a 20% sulfuric acid for 2 minutes at a current density of 2 A/dm$^2$, and finally treated with a 2.5% sodium silicate aqueous solution kept at 70° C. for 1 minute to provide an anodized aluminum plate (Support I).

On this Support I was coated the following photosensitive coating composition.

| | |
|---|---|
| Copolymer I | 0.86 g |
| 2-Methoxy-4-hydroxy-5-benzoylbenzene Sulfonate of p-Diazodiphenylamine/Paraformaldehyde Condensate | 0.10 g |
| Oil Blue #603* | 0.03 g |
| Oxalic Acid (dihydrate) | 0.01 g |
| 2-Methoxyethanol | 5.5 g |
| Methanol | 5.5 g |
| Ethylene Dichloride | 5.5 g |

*A product of Orient Chemical Ind., Co. The coating was dried at 100° C. for 2 minutes. The coating weight was 2.0 g/m² on a dry basis.

After storage at 45° C. and 75% RH for 5 days, this presensitized plate was imagewise exposed for 1 minute through a transparent negative original to light from a metal halide lamp operated at 2 kw and 3.5 A ("PS Light", produced by Fuji Photo Film Co., Ltd.) with a 1 m separation from the light source, and then developed with a developer of the following composition.

| | |
|---|---|
| Benzyl Alcohol | 30 g |
| Sodium Silicate (40% aq. soln.) | 15 g |
| Sodium Isopropylnaphthalene Sulfonate | 10 g |
| Water | 945 g |

After immersion in the developer for 1 minute at room temperature (about 20°–30° C.), the plate was lightly rubbed with a cotton pad whereby the unexposed areas of the coating were removed from the support to produce a lithographic printing plate. The plate was rinsed with water, dried at 50° C. for 3 minutes and coated with gum arabic. One hour later the plate was installed in a Rota Printer for printing whereby prints of excellent quality substantially free of scumming were produced. The upper limit of the length of the printing run of this plate stored as described above was investigated, which demonstrated that this plate could provide a substantially equal number of prints to that which could be obtained with another printing plate which utilized a photosensitive composition which was equivalent to the above-described photosensitive composition except that no oxalic acid or a salt thereof, but which had not been so stored, was used. When each of these plates was subjected to printing with a Rota Printer, about one hundred thousand prints were produced with each.

COMPARATIVE EXAMPLES 1-17

On a piece of an anodized aluminum plate produced as described in Example 1 was coated each of the photosensitive compositions described in Example 1 except for using 0.01 g of the additives shown in the following table, respectively, instead of oxalic acid to produce a dried coating weight of about 2.0 g/m². Each coated sample was left at 45° C., 75% RH for five days, then exposed, developed and rinsed in a similar manner as described in Example 1. After drying at 50° C. for 3 minutes, the plates were then each set on a Rota Printer. All of these plates gave prints with a poorer quality than those produced by the plate utilizing the coating composition of this invention containing oxalic acid with respect to the level of scumming in the non-image area.

TABLE

| Comparative Example | Additive | Print Quality* |
|---|---|---|
| 1 | None | Fair |
| 2 | Citric Acid | Moderate-Fair |
| 3 | Phosphoric Acid (85% aq. soln.) | Moderate |
| 4 | p-Toluene-sulfonic Acid (monohydrate) | Moderate-Fair |
| 5 | Boric Acid | Fair |
| 6 | Sulfuric Acid | Moderate |
| 7 | Polyphosphoric Acid | Good-Moderate |
| 8 | Adipic Acid | Moderate-Fair |
| 9 | Sulfamic Acid | Moderate-Fair |
| 10 | Tartaric Acid | Moderate |
| 11 | Glycine | Moderate-Fair |
| 12 | Sodium Salicylate | Fair |
| 13 | Ammonium Sulfamate | Moderate-Fair |
| 14 | Zinc Chloride | Moderate-Fair |
| 15 | Magnesium Nitrate (hexahydrate) | Fair |
| 16 | ε-Caprolactam | Fair |
| 17 | γ-Butyrolactam | Fair |
| Example 1 | Oxalic Acid (dihydrate) | Excellent |

*The print quality was evaluated using the following grades.
Excellent: Completely free of scumming
Good: Substantially free of scumming
Moderate: Scummed slightly in background
Fair: Scummed background

EXAMPLE 2

A piece of an anodized aluminum plate (I) produced as described in Example 1 was coated with a photosensitive coating composition of the following formulation.

| | |
|---|---|
| Copolymer (I) (as described in Example 1) | 0.75 g |
| Shellac | 0.10 g |
| Diazo Resin (as described in Example 1) | 0.12 g |
| Oil Blue #603 (manufactured by Orient Chemical Ind., Co.) | 0.02 g |
| Oxalic Acid (dihydrate) | 0.008 g |
| 2-Methoxyethanol | 7.0 g |
| Methanol | 7.0 g |
| Ethylene Dichloride | 7.0 g |

The coating amount was 1.6 g/m² on a dry basis. After about three months storage at room temperature, the plate was exposed to light from the same light source as in Example 1, developed with the same developer as described in Example 1, coated with gum arabic, and finally installed in a Rota Printer for printing. No scumming in the non-image area was observed and excellent quality prints were obtained.

EXAMPLE 3

Copolymer (II) containing 2-hydroxyethyl methacrylate was synthesized in a similar manner as described in Example 1. The composition of this copolymer was 2-hydroxyethyl methacrylate/acrylonitrile/methyl methacrylate/methacrylic acid=60:10:27.5:2.5 in weight %.

A photosensitive coating composition of the following formulation was coated on an anodized aluminum plate (I) produced as described in Example 1.

| | |
|---|---|
| Copolymer (II) | 0.85 g |
| Diazo Resin (as described in Example 1) | 0.12 g |
| Oil Blue #603 (manufactured by Orient Chemical Ind., Co.) | 0.02 g |
| Oxalic Acid (dihydrate) | 0.008 g |

| | | |
|---|---|---|
| 2-Methoxyethanol | 7.0 | g |
| Methanol | 7.0 | g |
| Ethylene Dichloride | 7.0 | g |

The dry coating amount was 1.6 g/m². The plate was developed in a similar manner as described in Example 1, and set on a Rota Printer for printing after coating with gum arabic. No scumming in the non-image area was observed and clear prints were obtained.

EXAMPLE 4

A piece of an anodized aluminum plate (I) produced as described in Example 1 was coated with a photosensitive coating composition of the following formulation.

| | | |
|---|---|---|
| Shellac | 0.88 | g |
| Diazo Resin (as described in Example 1) | 0.09 | g |
| Oil Blue #603 (manufactured by Orient Chemical Ind., Co.) | 0.02 | g |
| Oxalic Acid (dihydrate) | 0.01 | g |
| 2-Methoxyethanol | 6.0 | g |
| Methanol | 4.0 | g |
| Ethylene Dichloride | 10.0 | g |

The coating amount was 1.8 g/m² on a dry basis. After about three months storage at room temperature, the plate was exposed to light from the same light source as in Example 1, developed with a developer having the following composition:

| | |
|---|---|
| Isopropyl Alcohol | 60 g |
| Benzyl Alcohol | 7 g |
| Sodium Tertiary Phosphate | 3 g |
| Sodium Isopropylnaphthalene Sulfonate | 20 g |
| Water | 910 g | coated with gum arabic, and finally installed in a Hidel KOR Printer for printing. No scumming of the non-image area was observed and excellent quality prints were obtained.

EXAMPLE 5

A piece of an anodized aluminum plate (I) produced as described in Example 1 was coated with a photosensitive coating composition of the following formulation.

| | | |
|---|---|---|
| 2-Hydroxyethyl Methacrylate Copolymer (II) (as described in Example 3) | 0.70 | g |
| Polyvinylformal Resin, PVF #100 (produced by Denki Kagaku Kogyo K.K.) | 0.15 | g |
| Diazo Resin (as described in Example 1) | 0.12 | g |
| Oil Blue #603 (manufactured by Orient Chemical Ind., Co.) | 0.02 | g |
| Oxalic Acid (dihydrate) | 0.008 | g |
| 2-Methoxyethanol | 7.0 | g |
| Methanol | 7.0 | g |
| Ethylene Dichloride | 7.0 | g |

The coating amount was 1.6 g/m² on a dry basis. The plate was exposed and developed in a similar manner as described in Example 1, coated with gum arabic, and installed in a Rota Printer for printing. No scumming of the non-image area was observed and excellent quality prints were obtained.

Nextly, a test to determine printing durability was carried out using the coated plates obtained in Examples 3 and 5. As a result, the printing durability of the plate obtained in Example 5 was higher by about 10 to about 20% as compared with that obtained in Example 3.

In addition, after storage of the coated plates obtained in Examples 3 and 5 for about 6 months, the plates were exposed and developed in a similar manner to that described in Example 1, coated with gum arabic, and installed in a Rota Printer for printing. No scumming of the non-image area was observed and excellent quality prints were obtained.

EXAMPLE 6

A piece of an anodized aluminum plate (I) produced as described in Example 1 was coated with a photosensitive coating composition of the following formulation.

| | | |
|---|---|---|
| 2-Hydroxyethyl Methacrylate Copolymer (II) (as described in Example 3) | 0.80 | g |
| Diazo Resin (as described in Example 1) | 0.15 | g |
| Oil Blue #603 (manufactured by Orient Chemical Ind., Co.) | 0.04 | g |
| Sodium Oxalate | 0.01 | g |
| 2-Methoxyethanol | 7.0 | g |
| Methanol | 7.0 | g |
| Ethylene Dichloride | 4.0 | g |
| Water | 3.0 | g |

The coating amount was 1.8 g/m² on a dry basis. After about three months storage at room temperature, the plate was exposed and developed as described in Example 1 using a developer as described in Example 1, coated with gum arabic, and installed in a Hidel KOR Printer for printing. No scumming of the non-image area was observed and excellent quality prints were obtained.

While the invention has been described in detail and with reference to specific embodiments thereof, it will be apparent to one skilled in the art that various changes and modifications can be made therein without departing from the spirit and scope thereof.

What is claimed is:

1. A pre-sensitized lithographic plate comprising an aluminum support anodized in sulfuric acid and thereafter treated with a silicate salt having thereon a layer of a photosensitive diazo composition comprising (a) a diazo resin, which is a salt of a condensate of p-diazodiphenylamine with formaldehyde, (b) an organic high molecular weight binder wherein said organic high molecular weight binder is selected from the group consisting of an organic high molecular weight binder which has an acid value of from about 10 to about 100 and contains both the recurring unit represented by the following general formula (I):

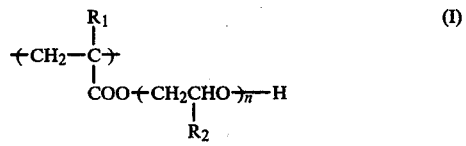

wherein $R_1$ represents a hydrogen atom or a methyl group; $R_2$ represents a hydrogen atom, a methyl group, an ethyl group or a chloromethyl group; and n is an integer from 1 to 10; and the recurring unit represented by the following general formula (II):

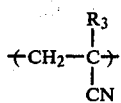 (II)

wherein $R_3$ represents a hydrogen atom or a methyl group; and (c) from about 0.1 to about 5% by weight of oxalic acid, based on the total amount of said composition, which provides lowered staining in background areas and extended shelf life to said pre-sensitized lithographic plate.

2. The pre-sensitized lithographic plate of claim 1, wherein said salt is a phenol salt, a fluorocapric acid salt or a sulfonic acid salt.

3. The pre-sensitized lithographic plate of claim 2, wherein said salt is a sulfonic acid salt selected from the group consisting of the salt of triisopropyl-naphthalenesulfonic acid, 4,4-biphenyldisulfonic acid, 5-nitro-o-toluenesulfonic acid, 5-sulfosalicyclic acid, 2,5-dimethylbenzenesulfonic acid, 2-nitrobenzenesulfonic acid, 3-chlorobenzenesulfonic acid, 3-bromobenzenesulfonic acid, 2-chloro-5-nitrobenzenesulfonic acid, 2-fluorocaprylnaphthalenesulfonic acid, 1-naphthaol-5-sulfonic acid, 2-methoxy-4-hydroxy-5-benzoylbenzenesulfonic acid and p-tolunesulfonic acid.

4. The pre-sensitized lithographic plate of claim 3, wherein said diazo resin is 2-methoxy-4-hydroxy-5-benzoyl-benzenesulfonic acid salt of the condensate of p-diazodiphenylamine with formaldehyde.

5. The presensitized lithographic plate of claim 1, wherein said composition contains from 0.2 to 4% by weight of oxalic acid based on the total amount of said composition.

6. The presensitized lithographic plate of claim 5, wherein the layer of the composition is coated in an amount of from about 0.1 to about 5.0 g/m².

* * * * *